(12) United States Patent
Yuan et al.

(10) Patent No.: US 11,257,418 B2
(45) Date of Patent: Feb. 22, 2022

(54) DRIVING UNIT AND DRIVING METHOD THEREOF, GATE DRIVING CIRCUIT AND DISPLAY SUBSTRATE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Zhidong Yuan, Beijing (CN); Can Yuan, Beijing (CN); Haixia Xu, Beijing (CN); Meng Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 208 days.

(21) Appl. No.: 16/613,643

(22) PCT Filed: Apr. 19, 2019

(86) PCT No.: PCT/CN2019/083448
§ 371 (c)(1),
(2) Date: Nov. 14, 2019

(87) PCT Pub. No.: WO2020/010892
PCT Pub. Date: Jan. 16, 2020

(65) Prior Publication Data
US 2021/0335201 A1    Oct. 28, 2021

(30) Foreign Application Priority Data

Jul. 13, 2018    (CN) .......................... 201810770131.6

(51) Int. Cl.
*G09G 3/20* (2006.01)
*G09G 3/3225* (2016.01)

(52) U.S. Cl.
CPC ......... *G09G 3/2092* (2013.01); *G09G 3/3225* (2013.01); *G09G 2300/0426* (2013.01);
(Continued)

(58) Field of Classification Search
CPC ............... G09G 3/2092; G09G 3/3225; G09G 2300/0426; G09G 2310/0286; G09G 2310/061; G09G 2310/08
See application file for complete search history.

(56) References Cited

U.S. PATENT DOCUMENTS 7,639,217 B2    12/2009    Shin
10,204,587 B2    2/2019    Chen et al.
(Continued)

FOREIGN PATENT DOCUMENTS

CN    104269134 A    1/2015
CN    104809985 A    7/2015
(Continued)

OTHER PUBLICATIONS

First Office Action dated Jul. 22, 2019, for corresponding Chinese application 201810770131.6.
(Continued)

*Primary Examiner* — Amare Mengistu
*Assistant Examiner* — Jennifer L Zubajlo
(74) *Attorney, Agent, or Firm* — Nath, Goldberg & Meyer; Joshua B. Goldberg

(57) ABSTRACT

The present disclosure provides a driving unit, a driving method thereof, a gate driving circuit, and a display substrate. The driving unit includes: a shift register including a pull-up node, a pull-down node and a driving signal output terminal; and a first output circuit including a first control
(Continued)

sub-circuit, a second control sub-circuit, an output sub-circuit, and a first signal output terminal; the first control sub-circuit and the output sub-circuit are coupled at a first node, and the first control sub-circuit, the second control sub-circuit and the output sub-circuit are coupled at a second node.

19 Claims, 7 Drawing Sheets

(52) U.S. Cl.
CPC ............... *G09G 2310/0286* (2013.01); *G09G 2310/061* (2013.01); *G09G 2310/08* (2013.01)

(56) References Cited

U.S. PATENT DOCUMENTS

| | | |
|---|---|---|
| 2016/0372046 A1 | 12/2016 | Wang et al. |
| 2017/0039950 A1 | 2/2017 | Li et al. |
| 2018/0174660 A1 | 6/2018 | Li |
| 2018/0204495 A1 | 7/2018 | Wang et al. |
| 2020/0105202 A1* | 4/2020 | Yuan ................ G09G 3/3266 |
| 2021/0065630 A1* | 3/2021 | Feng ................ G11C 19/28 |

FOREIGN PATENT DOCUMENTS

| | | | |
|---|---|---|---|
| CN | 104992663 A | | 10/2015 |
| CN | 105788508 A | | 7/2016 |
| CN | 106531112 A | | 3/2017 |
| CN | 107093415 A | | 8/2017 |
| CN | 107248390 A | * | 10/2017 |
| CN | 107248390 A | | 10/2017 |
| CN | 108538257 A | | 9/2018 |
| KR | 20060079041 A | | 7/2006 |
| WO | 2017202124 A9 | | 2/2018 |

OTHER PUBLICATIONS

Second Office Action dated Mar. 3, 2020, for corresponding Chinese application 201810770131.6.

* cited by examiner

DRIVING UNIT AND DRIVING METHOD THEREOF, GATE DRIVING CIRCUIT AND DISPLAY SUBSTRATE

CROSS-REFERENCE TO RELATED APPLICATION

This application claims the benefit of priority to Chinese Patent Application No. 201810770131.6 filed on Jul. 13, 2018, the contents of which are incorporated herein in their entirety by reference.

TECHNICAL FIELD

The present disclosure relates to the field of display technologies, and in particular, to a driving unit, a driving method thereof, a gate driving circuit, and a display substrate.

BACKGROUND

When driving organic light-emitting diodes (OLEDs) in an OLED display panel, the display brightness of the display panel may be non-uniform due to performance differences (e.g., process-induced differences, aging-induced differences) of the driving transistors or the OLEDs. Therefore, it is often necessary to compensate for the performance of the driving transistors or the OLEDs.

SUMMARY

In an aspect, the present disclosure provides a driving unit including: a shift register including a pull-up node, a pull-down node and a driving signal output terminal; and a first output circuit configured to output a double pulse signal in a preset time period under control of a voltage of the pull-up node, a voltage of the pull-down node and a voltage provided through the driving signal output terminal.

According to an embodiment of the present disclosure, the first output circuit includes: a first control sub-circuit, a second control sub-circuit and an output sub-circuit; the first control sub-circuit and the output sub-circuit are coupled at a first node, and the first control sub-circuit, the second control sub-circuit and the output sub-circuit are coupled at a second node;

the first control sub-circuit is coupled to the pull-up node and the pull-down node, and is configured to control a voltage at the first node to be at an active level in the preset time period under control of the voltage of the pull-up node, the voltage of the pull-down node, and a voltage at the second node, wherein the preset time period includes: a first sub-period, a second sub-period and a third sub-period which are successively arranged;

the second control sub-circuit is coupled to the pull-down node and the driving signal output terminal, and is configured to control the voltage at the second node to be at an inactive level in the first sub-period and the third sub-period and to be at the active level in the second sub-period under control of the voltage of the pull-down node and the voltage provided through the driving signal output terminal; and the output sub-circuit is coupled to a first signal output terminal, and is configured to output a voltage at the active level through the first signal output terminal in response to the voltage at the first node being at the active level and the voltage at the second node being at the inactive level, and output a voltage at the inactive level through the first signal output terminal in response to the voltage at the second node being at the active level.

According to an embodiment of the present disclosure, the first control sub-circuit includes: a first transistor, a second transistor, and a third transistor;

a control electrode of the first transistor is coupled to the pull-up node, a first electrode of the first transistor is coupled to a first control signal input terminal, and a second electrode of the first transistor is coupled to the first node;

a control electrode of the second transistor is coupled to the pull-down node, a first electrode of the second transistor is coupled to the first node, and a second electrode of the second transistor is coupled to a first operating power supply terminal, wherein the first operating power supply terminal is configured to provide a first operating voltage at the inactive level; and a control electrode of the third transistor is coupled to the second node, a first electrode of the third transistor is coupled to the first node, and a second electrode of the third transistor is coupled to the first operating power supply terminal.

According to an embodiment of the present disclosure, the second control sub-circuit includes: a fourth transistor and a fifth transistor;

a control electrode of the fourth transistor is coupled to the pull-down node, a first electrode of the fourth transistor is coupled to a second operating power supply terminal, and a second electrode of the fourth transistor is coupled to the second node, wherein the second operating power supply terminal is configured to provide a second operating voltage at the active level; and a control electrode of the fifth transistor is coupled to the driving signal output terminal, a first electrode of the fifth transistor is coupled to the second node, and a second electrode of the fifth transistor is coupled to a second control signal input terminal.

According to an embodiment of the present disclosure, the output sub-circuit includes: a sixth transistor, a seventh transistor, an eighth transistor and a first capacitor, a control electrode of the sixth transistor is coupled to the first control signal input terminal, a first electrode of the sixth transistor is coupled to the second operating power supply terminal, and a second electrode of the sixth transistor is coupled to the first node;

a control electrode of the seventh transistor is coupled to the first node, a first electrode of the seventh transistor is coupled to the second operating power supply terminal, and a second electrode of the seventh transistor is coupled to the first signal output terminal;

a control electrode of the eighth transistor is coupled to the second node, a first electrode of the eighth transistor is coupled to the first signal output terminal, and a second electrode of the eighth transistor is coupled to the first operating power supply terminal; and a first terminal of the first capacitor is coupled to the first node, and a second terminal of the first capacitor is coupled to the first signal output terminal.

According to an embodiment of the present disclosure, the output sub-circuit includes: a sixth transistor, a seventh transistor, an eighth transistor and a first capacitor;

a control electrode and a first electrode of the sixth transistor are respectively coupled to a third control signal input terminal, and a second electrode of the sixth transistor is coupled to the first node;

a control electrode of the seventh transistor is coupled to the first node, a first electrode of the seventh transistor is coupled to the third control signal input terminal, and a second electrode of the seventh transistor is coupled to the first signal output terminal;

a control electrode of the eighth transistor is coupled to the second node, a first electrode of the eighth transistor is coupled to the first signal output terminal, and a second electrode of the eighth transistor is coupled to the first operating power supply terminal; and a first terminal of the first capacitor is coupled to the first node, and a second terminal of the first capacitor is coupled to the first signal output terminal.

According to an embodiment of the present disclosure, the driving unit further includes: a second output circuit;

the second output circuit is coupled to the pull-up node, the pull-down node, and the first signal output terminal, respectively, and is configured to output a voltage at the active level through a second signal output terminal in the preset time period under control of the voltage of the pull-up node and the voltage of the pull-down node.

According to an embodiment of the present disclosure, the second output circuit includes: a ninth transistor and a tenth transistor;

a control electrode of the ninth transistor is coupled to the pull-up node, a first electrode of the ninth transistor is coupled to the first control signal input terminal, and a second electrode of the ninth transistor is coupled to the second signal output terminal; and a control electrode of the tenth transistor is coupled to the pull-down node, a first electrode of the tenth transistor is coupled to the second signal output terminal, and a second electrode of the tenth transistor is coupled to the first operating power supply terminal.

According to an embodiment of the present disclosure, the driving unit further includes a second output circuit;

the second output circuit includes: a ninth transistor and a tenth transistor;

a control electrode of the ninth transistor is coupled to the pull-up node, a first electrode of the ninth transistor is coupled to the first control signal input terminal, and a second electrode of the ninth transistor is coupled to a second signal output terminal; and a control electrode of the tenth transistor is coupled to the pull-down node, a first electrode of the tenth transistor is coupled to the second signal output terminal, and a second electrode of the tenth transistor is coupled to the first operating power supply terminal.

According to an embodiment of the present disclosure, the pull-up node is configured to provide a voltage at the active level in the preset time period, the driving signal output terminal is configured to provide a voltage at the active level in the preset time period, and the pull-down node is configured to provide a voltage at the inactive level in the preset time period.

According to an embodiment of the present disclosure, the first control signal input terminal is configured to provide a first clock signal, the second control signal input terminal is configured to provide a second clock signal, the first clock signal is at the active level in the preset time period, and the second clock signal is at the inactive level in the first sub-period and the third sub-period, and is at the active level in the second sub-period.

According to an embodiment of the present disclosure, the shift register includes a pre-charge reset circuit, a pull-up circuit, a pull-down circuit, and a pull-down control circuit;

the pre-charge reset circuit is coupled to a pre-charge signal input terminal and a reset signal input terminal, respectively, and coupled to the pull-up circuit at the pull-up node, the pull-down circuit and the pull-down control circuit are coupled at the pull-down node, and the pull-up circuit and the pull-down circuit are coupled at the driving signal output terminal.

According to an embodiment of the present disclosure, the pre-charge reset circuit includes an eleventh transistor, a twelfth transistor, and a thirteenth transistor; the pull-down control circuit includes a fourteenth transistor, a fifteenth transistor and a sixteenth transistor; the pull-up circuit includes a seventeenth transistor and a second capacitor; the pull-down circuit includes an eighteenth transistor;

a control electrode of the eleventh transistor is coupled to a fourth control signal input terminal, a first electrode of the eleventh transistor is coupled to the pre-charge signal input terminal, and a second electrode of the eleventh transistor is coupled to the pull-up node;

a control electrode of the twelfth transistor is coupled to the fourth control signal input terminal, a first electrode of the twelfth transistor is coupled to the pull-up node, and a second electrode of the twelfth transistor is coupled to a first electrode of the thirteenth transistor;

a control electrode of the thirteenth transistor is coupled to the reset signal input terminal, and a second electrode of the thirteenth transistor is coupled to the first operating power supply terminal;

a control electrode and a first electrode of the fourteenth transistor are respectively coupled to the second operating power supply terminal, and a second electrode of the fourteenth transistor is coupled to the pull-down node;

a control electrode of the fifteenth transistor is coupled to the pull-down node, a first electrode of the fifteenth transistor is coupled to the pull-up node, and a second electrode of the fifteenth transistor is coupled to the first operating power supply terminal;

a control electrode of the sixteenth transistor is coupled to the pull-up node, a first electrode of the sixteenth transistor is coupled to the pull-down node, and a second electrode of the sixteenth transistor is coupled to the first operating power supply terminal;

a control electrode of the seventeenth transistor is coupled to the pull-up node, a first electrode of the seventeenth transistor is coupled to a fifth control signal input terminal, and a second electrode of the seventeenth transistor is coupled to the driving signal output terminal;

a first terminal of the second capacitor is coupled to the pull-up node, and a second terminal of the second capacitor is coupled to the driving signal output terminal; and a control electrode of the eighteenth transistor is coupled to the pull-down node, a first electrode of the eighteenth transistor is coupled to the driving signal output terminal, and a second electrode of the eighteenth transistor is coupled to the first operating power supply terminal.

According to an embodiment of the present disclosure, the pre-charge reset circuit includes an eleventh transistor, a twelfth transistor, and a thirteenth transistor; the pull-down control circuit includes a fourteenth transistor, a fifteenth transistor, a sixteenth transistor and a nineteenth transistor; the pull-up circuit includes a seventeenth transistor and a second capacitor; the pull-down circuit includes an eighteenth transistor;

a control electrode of the eleventh transistor is coupled to a fourth control signal input terminal, a first electrode of the eleventh transistor is coupled to the pre-charge signal input terminal, and a second electrode of the eleventh transistor is coupled to the pull-up node;

a control electrode of the twelfth transistor is coupled to the fourth control signal input terminal, a first electrode of the twelfth transistor is coupled to the pull-up node, and a second electrode of the twelfth transistor is coupled to a first electrode of the thirteenth transistor;

a control electrode of the thirteenth transistor is coupled to the reset signal input terminal, and a second electrode of the thirteenth transistor is coupled to the first operating power supply terminal;

a control electrode of the fourteenth transistor is coupled to the fourth control signal input terminal, a first electrode of the fourteenth transistor is coupled to the second operating power supply terminal, and a second electrode of the fourteenth transistor is coupled to the pull-down node;

a control electrode of the fifteenth transistor is coupled to the pull-down node, a first electrode of the fifteenth transistor is coupled to the pull-up node, and a second electrode of the fifteenth transistor is coupled to the first operating power supply terminal;

a control electrode of the sixteenth transistor is coupled to the pull-up node, a first electrode of the sixteenth transistor is coupled to the pull-down node, and a second electrode of the sixteenth transistor is coupled to the first operating power supply terminal;

a control electrode of the seventeenth transistor is coupled to the pull-up node, a first electrode of the seventeenth transistor is coupled to a fifth control signal input terminal, and a second electrode of the seventeenth transistor is coupled to the driving signal output terminal;

a first terminal of the second capacitor is coupled to the pull-up node, and a second terminal of the second capacitor is coupled to the driving signal output terminal;

a control electrode of the eighteenth transistor is coupled to the pull-down node, a first electrode of the eighteenth transistor is coupled to the driving signal output terminal, and a second electrode of the eighteenth transistor is coupled to the first operating power supply terminal; and a control electrode of the nineteenth transistor is coupled to the fifth control signal input terminal, a first electrode of the nineteenth transistor is coupled to the second operating power supply terminal, and a second electrode of the nineteenth transistor is coupled to the pull-down node.

According to an embodiment of the present disclosure, all the transistors in the driving unit are transistors having a same conductivity type.

In another aspect, the present disclosure provides a gate driving circuit including: a plurality of cascaded driving units, wherein the driving unit is the driving unit according to the present disclosure;

the driving signal output terminal of the shift register of each of other driving units except a first-stage driving unit is coupled to a reset signal input terminal of the shift register of a previous-stage driving unit; and the driving signal output terminal of the shift register of each of other driving units except a last-stage driving unit is coupled to a pre-charge signal input terminal of the shift register of a next-stage driving unit.

In another aspect, the present disclosure provides a display substrate including: the gate driving circuit according to the present disclosure.

In another aspect, the present disclosure provides a driving method for driving a driving unit, the driving unit being the driving unit according to the present disclosure, and the driving method including:

in the first sub-period, controlling, by the first control sub-circuit, the voltage at the first node to be at the active level, and controlling, by the second control sub-circuit, the voltage at the second node to be at the inactive level, so that the output sub-circuit outputs the voltage at the active level through the first signal output terminal;

in the second sub-period, controlling, by the first control sub-circuit, the voltage at the first node to be at the active level, and controlling, by the second control sub-circuit, the voltage at the second node to be at the active level, so that the output sub-circuit outputs the voltage at the inactive level through the first signal output terminal; and in the third sub-period, controlling, by the first control sub-circuit, the voltage at the first node to be at the active level, and controlling, by the second control sub-circuit, the voltage at the second node to be at the inactive level, so that the output sub-circuit outputs the voltage at the active level through the first signal output terminal.

According to an embodiment of the present disclosure, in the preset time period, the voltage of the pull-up node is at the active level, the voltage of the pull-down node is at the inactive level, and the voltage provided through the driving signal output terminal is at the active level.

According to an embodiment of the present disclosure, an operating cycle of the shift register includes a pre-charge stage, an output stage and a reset stage, in the pre-charge stage, the pull-up node is pre-charged;

in the output stage, a voltage at the active level is output through the driving signal output terminal under control of the voltage of the pull-up node;

in the reset stage, the pull-up node is reset, the voltage of the pull-down node is controlled to be at the active level, and a voltage at the inactive level is output through the driving signal output terminal, and the preset time period is within the output stage.

DETAILED DESCRIPTION

To enable those skilled in the art to better understand the technical solutions of the present disclosure, a driving unit and a driving method thereof, a gate driving circuit and a display substrate according to the present disclosure are described in detail below with reference to the accompanying drawings.

When compensating for the performance of a driving transistor or an OLED in an OLED display panel, a method of external compensation is generally used. The external compensation is to sense a current at the driving transistor or the OLED by a sensing circuit, and to compensate for the non-uniformity in threshold voltage and mobility of the driving transistor, the aging of the OLED, and the like by using the sensed electrical signal and implementing a complex algorithm with the aid of an external integrated circuit chip.

In the process of sensing the properties of the driving transistor or the OLED (i.e., in a sensing stage), a double pulse signal needs to be provided to a control electrode of a sensing transistor in a pixel unit. However, since each stage of a shift register in a conventional gate driver on array (GOA) generally can only output a single pulse signal, but not a double pulse signal, the conventional GOA circuit cannot meet the driving requirement of the sensing transistor in the sensing stage. In this case, a double pulse signal may be output by a gate driving chip to drive the sensing transistor. However, the gate driver chip is not suitable for a narrow bezel design of a display substrate due to its large size.

In the present disclosure, "active level" refers to a voltage capable of controlling a corresponding transistor to be turned on, and "inactive level" refers to a voltage capable of controlling a corresponding transistor to be turned off. For example, when a transistor is an N-type transistor, the active level is a high level, and the inactive level is a low level. For example, when the transistor is a P-type transistor, the active level is a low level, and the inactive level is a high level. In the following description, an example in which each transistor is an N-type transistor is described.

Figure 1:
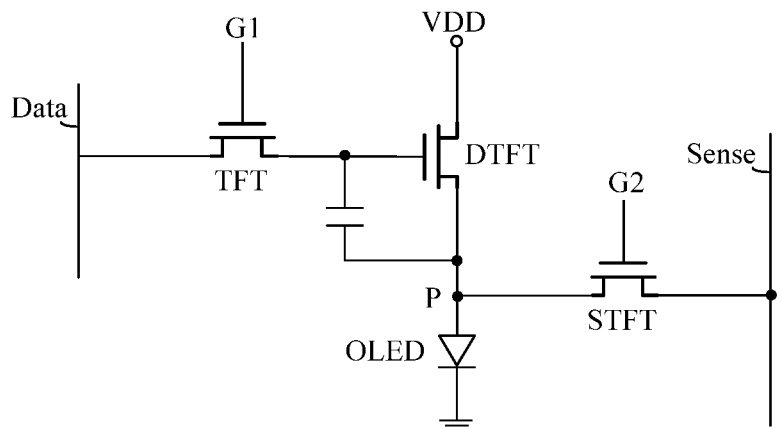
FIG. 1 is a schematic circuit diagram of a pixel unit with an external compensation function.

FIG. 1 is a schematic circuit diagram of a pixel unit with an external compensation function. As shown in FIG. 1, the pixel unit includes a switching transistor TFT, a driving transistor DTFT, a sensing transistor STFT, an organic light emitting diode OLED, and a capacitor. The switching transistor TFT has a control electrode coupled to a first gate line G1, a first electrode coupled to a data line Data, and a second electrode coupled to a control electrode of the driving transistor DTFT. A first electrode of the driving transistor DTFT is coupled to a power input terminal VDD, and a second electrode of the driving transistor DTFT is coupled to an anode of the organic light emitting diode OLED. The sensing transistor STFT has a control electrode coupled to a second gate line G2, a first electrode coupled to a signal sensing line Sense, and a second electrode coupled to the anode of the organic light emitting diode OLED. One terminal of the capacitor is coupled to the control electrode of the driving transistor DTFT, and the other terminal of the capacitor is coupled to the second electrode of the driving transistor DTFT. A cathode of the organic light emitting diode OLED is grounded.

Figure 2:
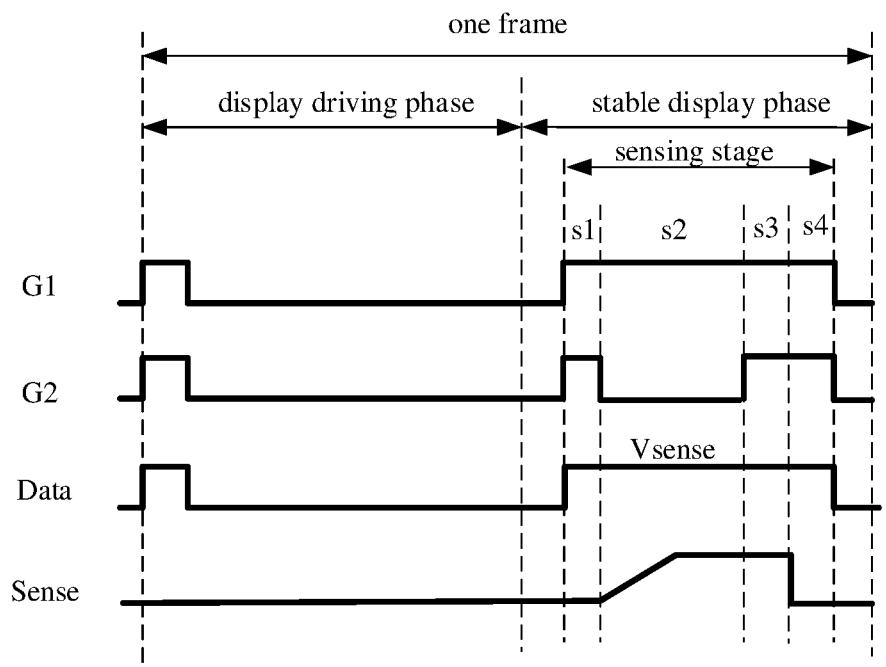
FIG. 2 is a timing diagram illustrating an operation of the pixel unit shown in FIG. 1.

FIG. 2 is a timing diagram illustrating an operation of the pixel unit shown in FIG. 1. As shown in FIG. 2, an operation process of the pixel unit includes the following two phases: a display driving phase and a stable display phase. The stable display phase includes a period of time as a sensing stage in which the property of the driving transistor DTFT or OLED is sensed. The sensing stage may include the following stages: a reset stage s1, an accumulation stage s2, a signal sensing stage s3, and a reset stage s4.

In the reset stage s1, the first gate line G1 and the second gate line G2 provide active levels, the sensing transistor STFT and the switching transistor TFT are turned on, a reset signal is written to point P through the signal sensing line Sense and the sensing transistor STFT, and a test voltage Vsense is written to the control electrode of the driving transistor DTFT through the data line Data and the switching transistor TFT.

In the accumulation stage s2, the second gate line G2 provides an inactive level, the sensing transistor STFT is turned off, and point P is charged by the current output from the driving transistor DTFT, so that the voltage at point P rises until the voltage at point P reaches (Vsense-Vth), where Vth is the threshold voltage of the driving transistor DTFT. When the voltage at point P reaches (Vsense-Vth), the driving transistor DTFT is turned off.

In the signal sensing stage s3, the second gate line G2 provides an active level, the sensing transistor STFT is turned on again, and the voltage at point P is measured as (Vsense-Vth) by the signal sensing line Sense. In the case that Vsense is known, the threshold voltage Vth of the driving transistor DTFT can be obtained from the voltage (Vsense-Vth) at point P.

In the reset stage s4, the second gate line G2 provides an active level, and the reset signal is written to point P again through the signal sensing line Sense and the sensing transistor STFT.

The switching transistor TFT is in an on state throughout the sensing stage, i.e., the signal provided by the first gate line G1 coupled to the control electrode of the switching transistor TFT is at an active level throughout the sensing stage. The sensing transistor STFT is in an on state in the reset stage s1, the signal sensing stage s3 and the reset stage s4, and is in an off state in the accumulation stage s2, i.e., the signal provided by the second gate line G2 coupled to the control electrode of the sensing transistor STFT is at an active level in the reset stage s1, the signal sensing stage s3 and the reset stage s4, and the signal provided by the second gate line G2 is at an inactive level in the accumulation stage s2. It can be seen that, during the whole sensing stage, a double pulse signal, in which a first pulse corresponds to the reset period s1, and a second pulse corresponds to the signal sensing stage s3 and the reset period s4, needs to be provided to the second gate line G2 (or the control electrode of the sensing transistor STFT).

As described above, since each stage of a shift register of a conventional GOA circuit can only output a single pulse signal, the driving requirement of the second gate line G2 in the sensing stage cannot be satisfied. When the gate driving chip is adopted for driving, although the driving requirement of the second gate line G2 in the sensing stage can be satisfied, the large size of the gate driving chip is not beneficial to the narrow bezel design of the display substrate.

Accordingly, the present disclosure provides a driving unit, a driving method thereof, a gate driving circuit and a display substrate that substantially obviate one or more of the problems due to limitations and disadvantages of the related art.

In the driving unit according to the present disclosure, a signal at a pull-up node, a signal at a pull-down node, and a signal output from a driving signal output terminal of a shift register serve as control signals to output a double pulse driving signal, so that the second gate line G2 in the pixel unit can be driven in the sensing stage.

Figure 5:
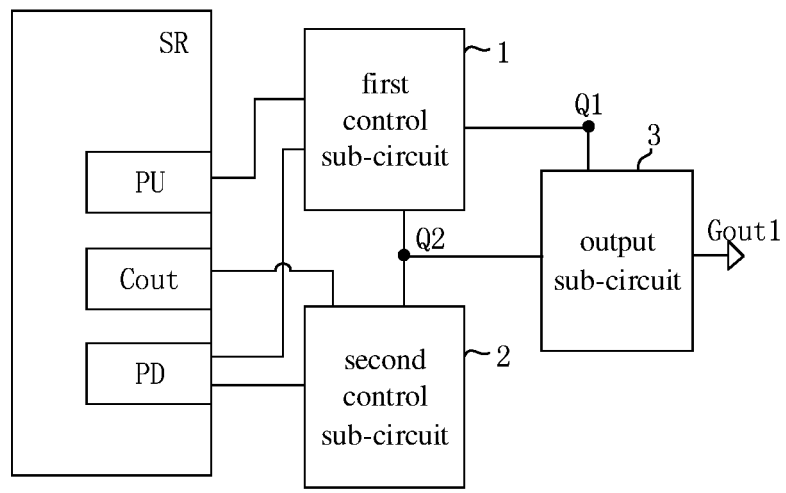
FIG. 5 is a block diagram of a driving unit according to an embodiment of the present disclosure.

According to an aspect of the present disclosure, there is provided a driving unit. FIG. 5 is a block diagram of a driving unit according to an embodiment of the present disclosure. As shown in FIG. 5, the driving unit includes a shift register SR and a first output circuit.

Figure 3A:
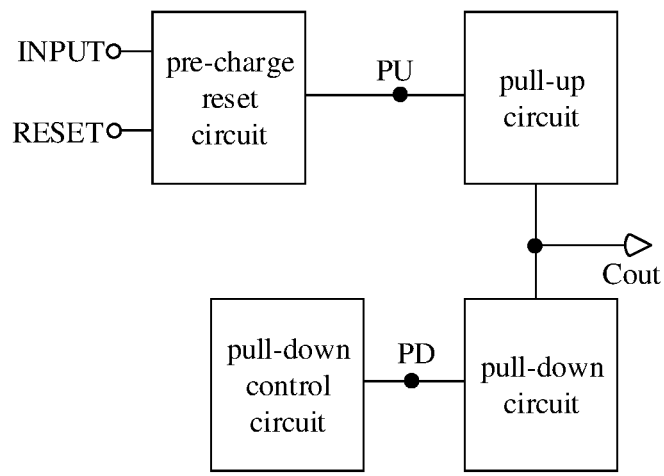
FIG. 3a is a block diagram of a shift register according to an embodiment of the present disclosure.
Figure 3B:
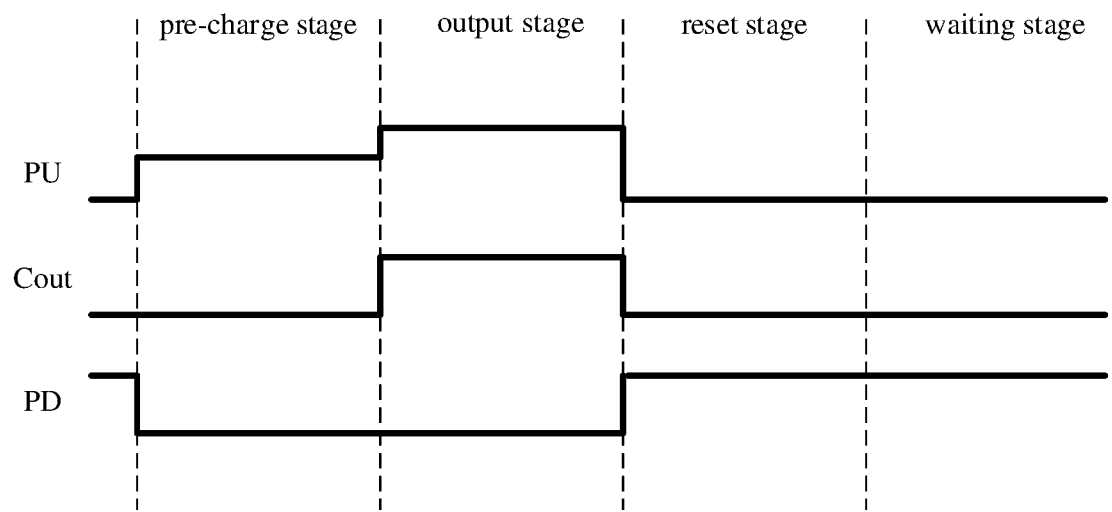
FIG. 3b is a timing diagram of an operation of a shift register according to an embodiment of the present disclosure.

FIG. 3a is a block diagram of a shift register SR according to an embodiment of the present disclosure, and FIG. 3b is a timing diagram of an operation of the shift register SR according to an embodiment of the present disclosure. As shown in FIG. 3a, the shift register SR includes a pre-charge reset circuit, a pull-up circuit, a pull-down control circuit, and a pull-down circuit. The pre-charge reset circuit is respectively coupled to a pre-charge signal input terminal INPUT and a reset signal input terminal RESET and coupled to the pull-up circuit at a pull-up node PU. The pull-down control circuit and the pull-down circuit are coupled at a pull-down node PD. The pull-up circuit and the pull-down circuit are coupled at a driving signal output terminal Cout.

An operating cycle of the shift register mainly includes the following three stages: a pre-charge stage, an output stage, and a reset stage.

In the pre-charge stage, the pull-up node PU is pre-charged by the pre-charge reset circuit under the control of a writing signal provided through the pre-charge signal input terminal INPUT, in preparation for the subsequent output stage.

In the output stage, under the control of a voltage of the pull-up node PU, a voltage at an active level is output to the driving signal output terminal Cout through the pull-up circuit, that is, a single pulse is output.

In the reset stage, under the control of a reset signal provided through the reset signal input terminal RESET, the pull-up node PU is reset by the pre-charge reset circuit, to disable the pull-up circuit. Meanwhile, the pull-down control circuit controls a voltage of the pull-down node PD to be at an active level, and the pull-down circuit outputs a voltage at an inactive level to the driving signal output terminal Cout under the control of the voltage of the pull-down node PD, so that the purpose of resetting is achieved.

In addition, after the reset stage is finished, the shift register is in a waiting stage (until the pre-charge stage of a next cycle arrives). In the waiting stage, the voltage of the pull-up node PU maintains at the inactive level, and the voltage of the pull-down node PD maintains at the active level, and thus, the driving signal output terminal Cout keeps outputting the voltage at the inactive level.

Figure 4A:
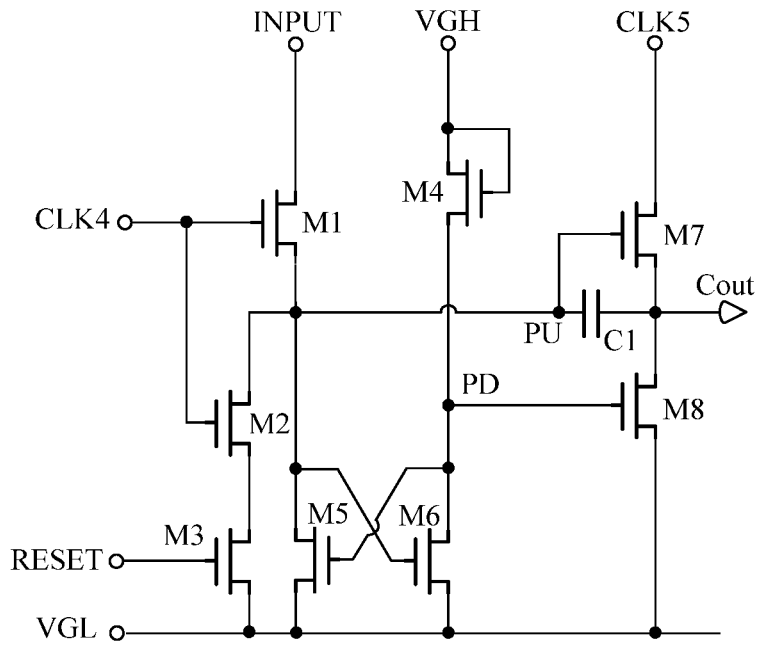
FIG. 4a is a schematic circuit diagram of a shift register according to an embodiment of the present disclosure.
Figure 4B:
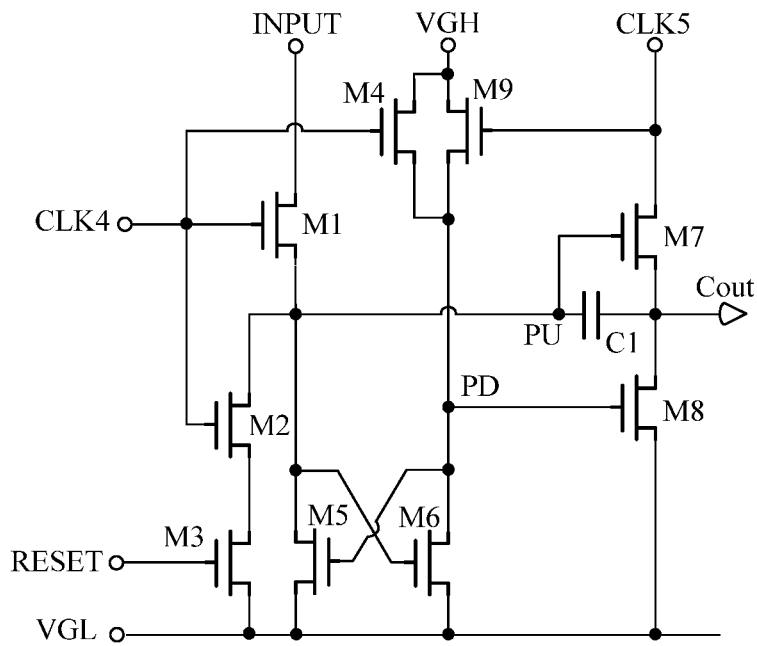
FIG. 4b is a schematic circuit diagram of a shift register according to another embodiment of the present disclosure.

FIG. 4a is a schematic circuit diagram of a shift register according to an embodiment of the present disclosure, and FIG. 4b is a schematic circuit diagram of a shift register according to another embodiment of the present disclosure.

As shown in FIG. 4a, the shift register has a circuit structure of 8T1C (eight transistors M1~M8 and one capacitor C1), in which the pre-charge reset circuit corresponds to transistors M1 to M3, the pull-up circuit corresponds to a transistor M7 and a capacitor C1, the pull-down control circuit corresponds to transistors M4 to M6, and the pull-down circuit corresponds to a transistor M8.

As shown in FIG. 4a, the pre-charge reset circuit includes an eleventh transistor M1, a twelfth transistor M2, and a thirteenth transistor M3; the pull-up circuit includes a seventeenth transistor M7 and a second capacitor C1; the pull-down control circuit includes a fourteenth transistor M4, a fifteenth transistor M5, and a sixteenth transistor M6; and the pull-down circuit includes an eighteenth transistor M8. The eleventh transistor M1 has a control electrode coupled to a fourth control signal input terminal CLK4, a first electrode coupled to the pre-charge signal input terminal INPUT, and a second electrode coupled to the pull-up node PU. The twelfth transistor M2 has a control electrode coupled to the fourth control signal input terminal CLK4, a first electrode coupled to the pull-up node PU, and a second electrode coupled to a first electrode of the thirteenth transistor M3. A control electrode of the thirteenth transistor M3 is coupled to the reset signal input terminal RESET, and a second electrode of the thirteenth transistor M3 is coupled to a first operating power supply terminal VGL. A first operating voltage at the inactive level is provided through the first operating power supply terminal VGL. The fourteenth transistor M4 has a control electrode and a first electrode respectively coupled to a second operating power supply terminal VGH, and a second electrode coupled to the pull-down node PD. A second operating voltage at the active level is provided through the second operating power supply terminal VGH. The fifteenth transistor M5 has a control electrode coupled to the pull-down node PD, a first electrode coupled to the pull-up node PU, and a second electrode coupled to the first operating power supply terminal VGL. The sixteenth transistor M6 has a control electrode coupled to the pull-up node PU, a first electrode coupled to the pull-down node PD, and a second electrode coupled to the first operating power supply terminal VGL. The seventeenth transistor M7 has a control electrode coupled to the pull-up node PU, a first electrode coupled to a fifth control signal input terminal CLK5, and a second electrode coupled to the driving signal output terminal Cout. A first terminal of the second capacitor C1 is coupled to the pull-up node PU, and a second terminal of the second capacitor C1 is coupled to the driving signal output terminal Cout. The eighteenth transistor M8 has a control electrode coupled to the pull-down node PD, a first electrode coupled to the driving signal output terminal Cout, and a second electrode coupled to the first operating power supply terminal VGL.

The shift register shown in FIG. 4b has a circuit structure of 9T1C (nine transistors M1~M9 and one capacitor C1), in which the pre-charge reset circuit corresponds to transistors M1 to M3, the pull-up circuit corresponds to a transistor M7 and a capacitor C1, the pull-down control circuit corresponds to transistors M4 to M6 and M9, and the pull-down circuit corresponds to a transistor M8. Compared to the circuit shown in FIG. 4a, the pull-down control circuit in the shift register shown in FIG. 4b further includes a nineteenth transistor M9. The nineteenth transistor M9 has a control electrode coupled to the fifth control signal input terminal CLK5, a first electrode coupled to the second operating power supply terminal VGH, and a second electrode coupled to the pull-down node PD. In addition, as shown in FIG. 4b, the control electrode of the fourteenth transistor M4 is coupled to the fourth control signal input terminal CLK4. In some embodiments, the fourth control signal input terminal CLK4 and the fifth control signal input terminal CLK5 are respectively coupled to corresponding clock signal lines, i.e., clock signals serve as control signals. The operations of the circuits shown in FIGS. 4a and 4b are the same as that of the circuit shown in FIG. 3a and will not be described in detail here.

It should be noted that the circuit structures of the shift registers shown in FIGS. 4a and 4b are only for illustrative purposes, and do not limit the present disclosure. It should be understood by those skilled in the art that any shift register adopting the above-mentioned operation processes (the pre-charge stage, the output stage and the reset stage) is within the scope of the present disclosure, and the examples are not illustrated herein.

Referring back to FIG. 5, the first output circuit includes: a first control sub-circuit 1, a second control sub-circuit 2 and an output sub-circuit 3. The first control sub-circuit 1 and the output sub-circuit 3 are coupled at a first node Q1, and the first control sub-circuit 1, the second control sub-circuit 2, and the output sub-circuit 3 are coupled at a second node Q2.

The first control sub-circuit 1 is coupled to the pull-up node PU of the shift register SR, the pull-down node PD of the shift register SR, and the second node Q2, and is configured to control a voltage at the first node Q1 to be at the active level in a preset time period in the output stage of the shift register SR under the control of the voltage at the pull-up node PU, the voltage at the pull-down node PD, and a voltage at the second node Q2. The preset time period includes: a first sub-period, a second sub-period, and a third sub-period that are successively arranged. It should be noted that the preset time period corresponds to the aforementioned sensing stage, the first sub-period corresponds to the reset stage s1 in FIG. 2, the second sub-period corresponds to the accumulation stage s2 in FIG. 2, and the third sub-period corresponds to the signal sensing stage s3 and the reset stage s4 in FIG. 2. The specific duration can be set and adjusted according to actual needs.

The second control sub-circuit 2 is coupled to the pull-down node PD of the shift register SR and the driving signal output terminal Cout of the shift register SR, and is configured to control the voltage at the second node Q2 to be at the inactive level in the first sub-period and the third sub-period, and control the voltage at the second node Q2 to be at the active level in the second sub-period, under the control of the voltage at the pull-down node PD and the voltage provided at the driving signal output terminal Cout.

The output sub-circuit 3 is coupled to the first node Q1, the second node Q2, and a first signal output terminal Gout1, and is configured to output a voltage at the active level through the first signal output terminal Gout1 when the voltage of the first node Q1 is at the active level and the voltage of the second node Q2 is at the inactive level, and output a voltage at the inactive level through the first signal output terminal Gout1 when the voltage of the second node Q2 is at the active level, under the control of the voltage of the first node Q1 and the voltage of the second node Q2.

The operating process of the driving unit according to the present disclosure in the preset time period includes three sub-periods. In the first sub-period, the voltage of the first node Q1 is at the active level, the voltage of the second node Q2 is at the inactive level, and the output sub-circuit 3 outputs the voltage at the active level, i.e., outputs the first pulse, through the first signal output terminal Gout1. In the second sub-period, the voltage of the first node Q1 is at the active level, the voltage of the second node Q2 is at the active level, and the output sub-circuit 3 outputs the voltage at the inactive level through the first signal output terminal Gout1. In the third sub-period, the voltage of the first node Q1 is at the active level, the voltage of the second node Q2 is at the inactive level, and the output sub-circuit 3 outputs the voltage at the active level, i.e., outputs the second pulse, through the first signal output terminal Gout1. Therefore, the driving unit according to the present disclosure can output a double pulse signal in the preset time period, so that the second gate line in the pixel unit can be driven in the sensing stage, and realization of narrow bezel is facilitated.

Figure 6:
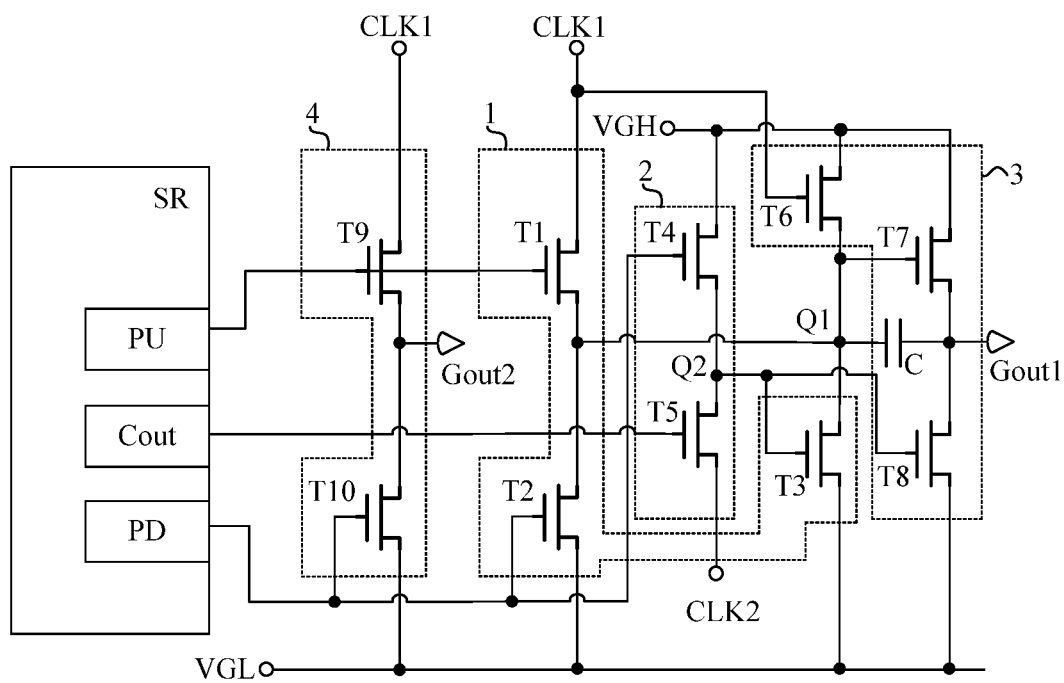
FIG. 6 is a schematic circuit diagram of a driving unit according to an embodiment of the present disclosure.

FIG. 6 is a schematic circuit diagram of a driving unit according to an embodiment of the present disclosure, and illustrates an embodiment of the driving unit shown in FIG. 5.

In some embodiments, the first control sub-circuit 1 is coupled to a first clock signal line through a first control signal input terminal CLK1 (i.e., a first clock signal provided through the first clock signal line is used as a control signal), and the first operating voltage is input to the first control sub-circuit 1 through the first operating power supply terminal VGL. The first control sub-circuit 1 is configured to: write the first clock signal provided through the first clock signal line and at the active level in the preset time period to the first node Q1 in the pre-charge stage and the output stage of the shift register SR under the control of the voltage of the pull-up node PU; write the first operating voltage provided through the first operating power supply terminal to the first node Q1 in the reset stage of the shift register SR under the control of the voltage of the pull-down node PD; and write the first operating voltage to the first node Q1 when the voltage of the second node Q2 is at the active level under the control of the voltage of the second node Q2. The first operating voltage at the inactive level is provided through the first operating power supply terminal VGL.

In some embodiments, as shown in FIG. 6, the first control sub-circuit 1 includes a first transistor T1, a second transistor T2, and a third transistor T3. A control electrode of the first transistor T1 is coupled to the pull-up node PU, a first electrode of the first transistor T1 is coupled to the first control signal input terminal CLK1, and a second electrode of the first transistor T1 is coupled to the first node Q1. A control electrode of the second transistor T2 is coupled to the pull-down node PD, a first electrode of the second transistor T2 is coupled to the first node Q1, and a second electrode of the second transistor T2 is coupled to the first operating power supply terminal VGL. A control electrode of the third transistor T3 is coupled to the second node Q2, a first electrode of the third transistor T3 is coupled to the first node Q1, and a second electrode of the third transistor T3 is coupled to the first operating power supply terminal VGL.

In some embodiments, the second control sub-circuit 2 is coupled to a second clock signal line through a second control signal input terminal CLK2 (i.e., a second clock signal provided through the second clock signal line serves as a control signal), and a second operating voltage is input to the second control sub-circuit 2 through the second operating power supply terminal VGH. The second control sub-circuit 2 is configured to: write the second operating voltage provided through the second operating power supply terminal to the second node Q2 in the reset stage of the shift register SR under the control of the voltage of the pull-down node PD; output the second clock signal provided through the second control signal input terminal CLK2 to the second node Q2 in the output stage of the shift register SR under the control of the voltage provided by the driving signal output terminal Cout, the second clock signal being at the inactive level in the first sub-period and the third sub-period, and at the active level in the second sub-period. The second operating voltage at the active level is provided through the second operating power supply terminal VGH.

In some embodiments, as shown in FIG. 6, the second control sub-circuit 2 includes a fourth transistor T4 and a fifth transistor T5. A control electrode of the fourth transistor T4 is coupled to the pull-down node PD, a first electrode of the fourth transistor T4 is coupled to the second operating power supply terminal VGH, and a second electrode of the fourth transistor T4 is coupled to the second node Q2. A control electrode of the fifth transistor T5 is coupled to the driving signal output terminal Cout, a first electrode of the fifth transistor T5 is coupled to the second node Q2, and a second electrode of the fifth transistor T5 is coupled to the second control signal input terminal CLK2.

In some embodiments, a control signal is input to the output sub-circuit 3 through a third control signal input terminal, and the output sub-circuit 3 is coupled to the first operating power supply terminal. The output sub-circuit 3 is configured to: write a voltage at the active level provided from the third control signal input terminal to the first signal output terminal Gout1 in the first sub-period and the third sub-period under the control of the voltage of the first node Q1; and write the first operating voltage provided through the first operating power supply terminal to the first signal output terminal Gout1 in the second sub-period under the control of the voltage of the second node Q2.

In some embodiments, as shown in FIG. 6, the output sub-circuit 3 includes a sixth transistor T6, a seventh transistor T7, an eighth transistor T8, and a first capacitor C. A control electrode of the sixth transistor T6 is coupled to the first control signal input terminal CLK1, a first electrode of the sixth transistor T6 is coupled to the second operating power supply terminal VGH, and a second electrode of the sixth transistor T6 is coupled to the first node Q1. A control electrode of the seventh transistor T7 is coupled to the first node Q1, a first electrode of the seventh transistor T7 is coupled to the second operating power supply terminal VGH, and a second electrode of the seventh transistor T7 is coupled to the first signal output terminal Gout1. A control electrode of the eighth transistor T8 is coupled to the second node Q2, a first electrode of the eighth transistor T8 is coupled to the first signal output terminal Gout1, and a second electrode of the eighth transistor T8 is coupled to the first operating power supply terminal VGL. A first terminal of the first capacitor C is coupled to the first node Q1, and a second terminal of the first capacitor C is coupled to the first signal output terminal Gout1. The control signal provided through the first control signal input terminal CLK1 is at the active level in the preset time period. In the present disclosure, the capacitor C can ensure stable output of the first signal output terminal Gout1.

Figure 8:
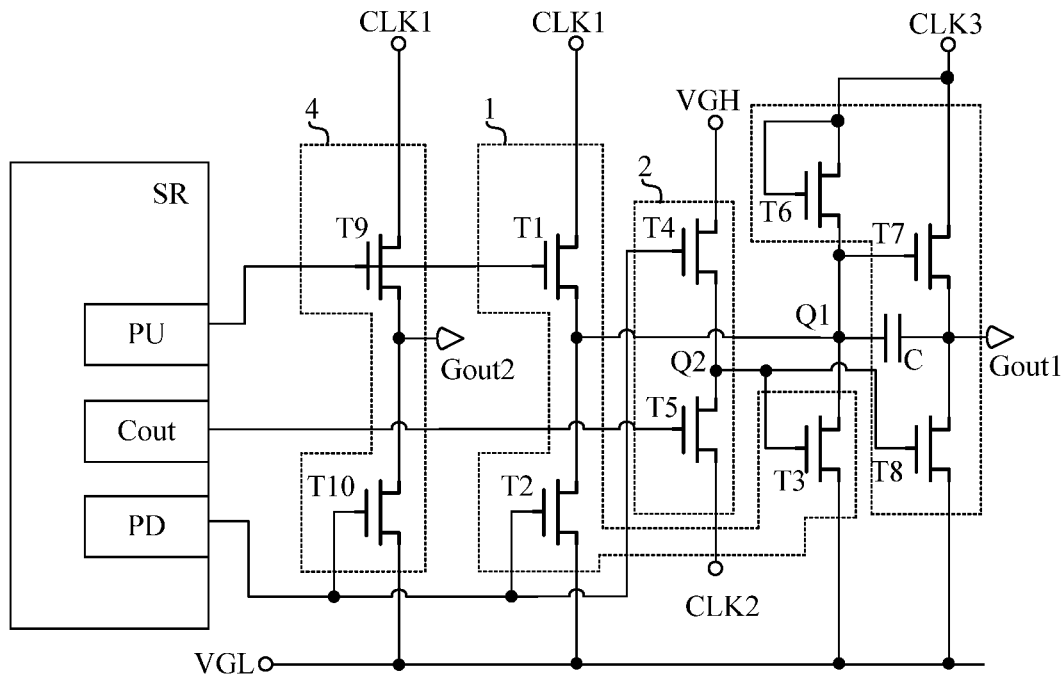
FIG. 8 is a schematic circuit diagram of a driving unit according to another embodiment of the present disclosure.

FIG. 8 is a schematic circuit diagram of a driving unit according to another embodiment of the present disclosure. The driving unit shown in FIG. 8 differs from the driving unit shown in FIG. 6 in the connection between the sixth transistor T6 and the seventh transistor T7. The control electrode and the first electrode of the sixth transistor T6 in the present embodiment are coupled to a third control signal input terminal CLK3, respectively, and the second electrode of the sixth transistor T6 is coupled to the first node Q1. The control signal input through the third control signal input terminal CLK3 may be the same as the control signal input through the first control signal input terminal CLK1. This allows the sixth transistor T6 and the seventh transistor T7 in this embodiment not to be constantly affected by a positive voltage, thereby improving the reliability of the circuit.

In some embodiments, the first control signal input terminal CLK1, the second control signal input terminal CLK2, the third control signal input terminal CLK3, the fourth control signal input terminal CLK4, and the fifth control signal input terminal CLK5 are respectively coupled to corresponding clock signal lines. In this case, the control signals input through the first control signal input terminal, the second control signal input terminal, the third control signal input terminal, the fourth control signal input terminal, and the fifth control signal input terminal are all clock signals. The clock signal input through the third control signal input terminal is at the active level in the preset time period.

Figure 7:
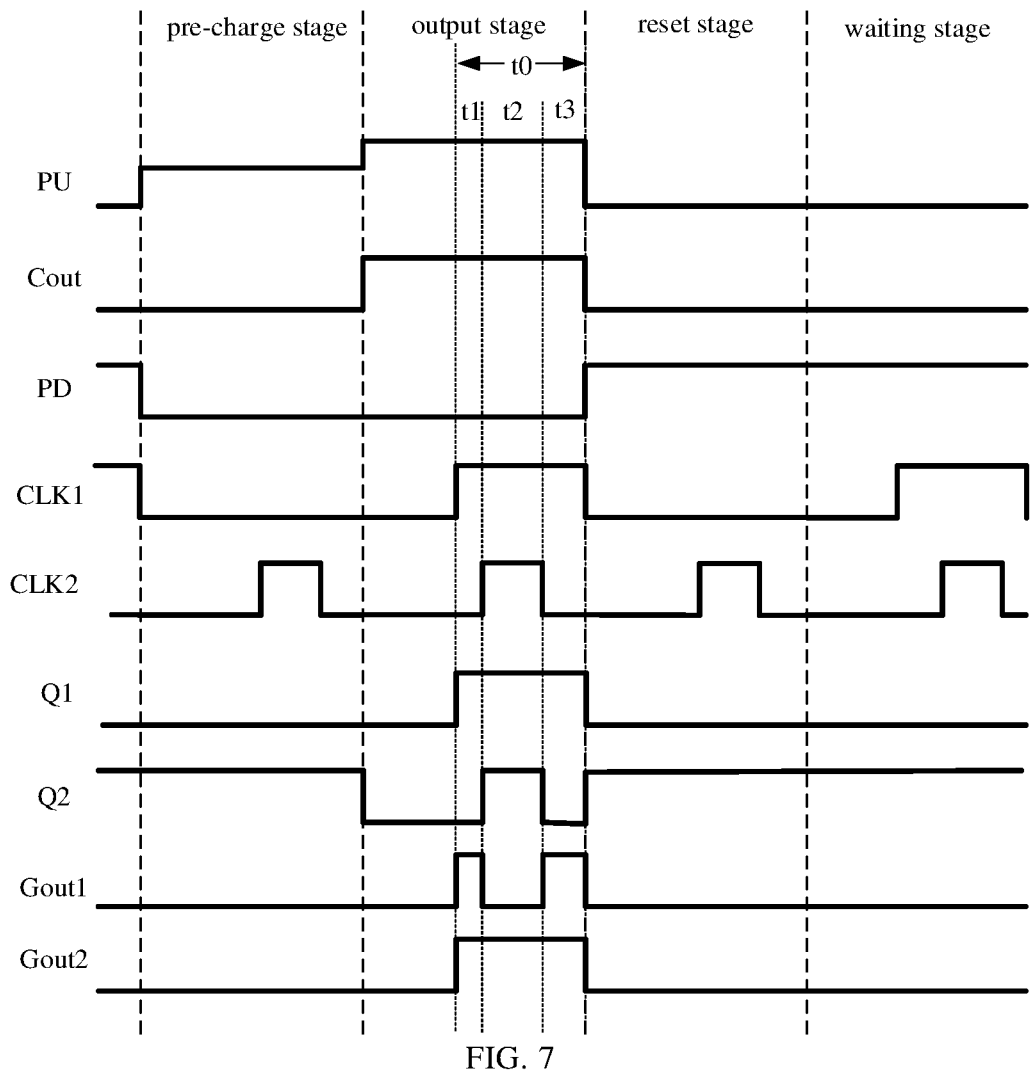
FIG. 7 is a timing diagram illustrating an operation of the driving unit shown in FIG. 6.

FIG. 7 is a timing diagram illustrating an operation of the driving unit shown in FIG. 6, and the operation process of the driving unit shown in FIG. 6 will be described with reference to FIG. 7. In the following description, it is assumed that each transistor is an N-type transistor, the first operating power supply terminal VGL provides a low-level operating voltage, and the second operating power supply terminal VGH provides a high-level operating voltage.

As shown in FIG. 7, the operation process of the driving unit corresponds to the operation process of the shift register SR, and mainly includes a pre-charge stage, an output stage, and a reset stage.

In the pre-charge stage of the shift register SR, the voltage at the pull-up node PU is at a high level, the voltage at the driving signal output terminal Cout is at a low level, and the voltage at the pull-down node PD is at a low level, the first clock signal provided through the first control signal input terminal CLK1 is at a low level, the second clock signal provided through the second control signal input terminal CLK2 is at a low level for a partial period and at a high level for a partial period.

In this case, since the voltage at the pull-up node PU is at a high level, the first transistor T1 is turned on, and the first clock signal is written to the first node Q1 through the first transistor T1. Since the first clock signal is at a low level, the voltage at the first node Q1 is at a low level, and the seventh transistor T7 is turned off. Meanwhile, the sixth transistor T6 is also in an off state under the control of the first clock signal at a low level.

Since the voltage at the pull-down node PD is at a low level, both the second transistor T2 and the fourth transistor T4 are turned off. Meanwhile, since the voltage at the driving signal output terminal Cout is at a low level, the fifth transistor T5 is turned off. The second node Q2 is in a floating state, and the second node Q2 maintains a high-level state at the end of a previous cycle, so that the third transistor T3 and the eighth transistor T8 are both turned on. The low-level operating voltage provided through the first operating power supply terminal VGL is written to the first node Q1 through the third transistor T3, thereby maintaining the voltage of the first node Q1 at a low level. The low-level operating voltage provided through the first operating power supply terminal VGL is written to the first signal output terminal Gout1 through the eighth transistor T8, so that the low-level voltage is output through the first signal output terminal Gout1.

In the output stage of the shift register SR, the voltage at the pull-up node PU is at a high level, the voltage at the driving signal output terminal Cout is at a high level, and the voltage at the pull-down node PD is at a low level. The output stage includes at least a preset time period t0 (corresponding to the sensing stage where the external compensation is performed). The preset time period t0 includes: a first sub-period t1, a second sub-period t2, and a third sub-period t3 that are successively arranged.

In the first sub-period t1, the first clock signal is at a high level, and the second clock signal is at a low level. At this time, since the voltage at the pull-up node PU maintains at a high level, the first transistor T1 continues to be on, so that the first clock signal can be continuously written to the first node Q1. Since the first clock signal is at a high level, the voltage at the first node Q1 is at a high level, and in this case, the sixth transistor T6 and the seventh transistor T7 are both turned on, and the seventh transistor T7 constitutes a diode.

Since the voltage at the pull-down node PD is at a low level, both the second transistor T2 and the fourth transistor T4 maintain an off state. Meanwhile, since the voltage at the driving signal output terminal Cout is at a high level, the fifth transistor 5 is turned on. In this case, the second clock signal may be written to the second node Q2 through the fifth transistor T5. Further, since the second clock signal is at a low level, the voltage at the second node Q2 is at a low level, and thus, both the third transistor T3 and the eighth transistor T8 are turned off.

In the case that the eighth transistor T8 is turned off, a high-level operating voltage provided through the second operating power supply terminal VGH is written to the first signal output terminal Gout1 through the seventh transistor T7, and the first signal output terminal Gout1 outputs a high-level voltage.

In the second sub-period t2, the first clock signal is at a high level, and the second clock signal is at a high level. Since the fifth transistor T5 is continuously turned on, the second clock signal at a high level is written to the second node Q2 through the fifth transistor T5. Since the voltage at the second node Q2 is at a high level, both the third transistor T3 and the eighth transistor T8 are turned on.

Since the eighth transistor T8 is turned on, the low-level operating voltage provided through the first operating power supply terminal VGL is written to the first signal output terminal Gout1 through the eighth transistor T8, and the first signal output terminal Gout1 outputs a low-level voltage.

It should be noted that, in the second sub-period, since the first transistor T1, the sixth transistor T6, and the third transistor T3 are all in the on state, the first clock signal (through the first transistor T1), the high-level operating voltage (through the sixth transistor T6), and the low-level operating voltage (through the third transistor T3) simultaneously charge the first node Q1. The magnitude of the voltage at the first node Q1 is related to width-to-length ratios of channels of the first transistor T1, the sixth transistor T6, and the third transistor T3. However, in the case that the voltage at the second node Q2 is at a high level, the first signal output terminal Gout1 always outputs a low-level voltage regardless of whether the voltage at the first node Q1 is at a high level or a low level.

When the voltage at the first node Q1 is at a high level, the seventh transistor T7 constitutes a diode since the sixth transistor T6 is turned on. In the case that the eighth transistor T8 is turned on, the seventh transistor T7 serves as a resistor having a large resistance, and the first signal output terminal Gout1 outputs a low-level voltage. When the voltage at the first node Q1 is at a low level, the seventh transistor T7 is turned off, the first signal output terminal Gout1 is charged, through the eighth transistor T8, only by the low-level operating voltage provided through the first operating power supply terminal VGL, and the first signal output terminal Gout1 outputs a low-level voltage. Only the case in which the voltage at the first node Q1 is at a high level in the second sub-period is illustrated in the figure.

In the third sub-period t3, the first clock signal is at a high level, and the second clock signal is at a low level. At this time, since the pull-up node PU maintains the high-level state, the first transistor T1 is continuously turned on, and the first clock signal is continuously written to the first node Q1. The voltage at the first node Q1 is at a high level, and at this time, the sixth transistor T6 and the seventh transistor T7 are both turned on, and the seventh transistor T7 constitutes a diode. Further, since the voltage at the pull-down node PD is at a low level, both the second transistor T2 and the fourth transistor T4 maintain an off state. Meanwhile, since the voltage at the driving signal output terminal Cout is at a high level, the fifth transistor 5 is turned on. The second clock signal may be written to the second node Q2 through the fifth transistor T5 at this time. Further, since the second clock signal is at a low level, the voltage at the second node Q2 is at a low level, and thus, both the third transistor T3 and the eighth transistor T8 are turned off. In the case that the eighth transistor T8 is turned off, the high-level operating voltage provided through the second operating power supply terminal VGH is written to the first signal output terminal Gout1 through the seventh transistor T7, and the first signal output terminal Gout1 outputs a high-level voltage.

Therefore, the first signal output terminal Gout1 of the driving unit according to the present disclosure can output a double pulse signal in the preset time period t0, so that the second gate line in the pixel unit can be driven in the sensing stage. The technical solution of the present disclosure is based on the GOA circuit, so the realization of narrow bezel of the display substrate is facilitated.

It should be noted that, in practical applications, a duration of the preset time period t0 may be less than a duration of the output stage of the shift register SR (the starting time of the preset time period t0 is later than the starting time of the output stage, but the ending time of the preset time period t0 is the same as the ending time of the output stage). In this case, in other time than the preset time period t0 of the output stage (the time within the output stage and before the preset time period t0), since the first clock signal is at a low level, the voltage at the first node Q1 is at a low level, and the seventh transistor T7 is turned off. At this time, although the fifth transistor T5 is turned on, the eighth transistor T8 is turned off since the second clock signal is at a low level, and the first signal output terminal Gout1 is in a floating state. The voltage at the first signal output terminal Gout1 maintains the voltage at the end of the pre-charge stage, i.e., the low-level voltage.

In the reset stage of the shift register SR, the voltage at the pull-up node PU is at a low level, the voltage at the driving signal output terminal Cout is at a low level, and the voltage at the pull-down node PD is at a high level. The first clock signal provided through the first control signal input terminal CLK1 is at a low level, and the second clock signal provided through the second control signal input terminal CLK2 is at a low level in a partial period and at a high level in a partial period.

Since the voltage at the pull-up node PU is at a low level, the first transistor T1 is turned off. Since the voltage at the pull-down node PD is at a high level, the second transistor T2 and the fourth transistor T4 are turned on, and the low-level operating voltage provided through the first operating power supply terminal VGL is written to the first node Q1 through the second transistor T2. The voltage at the first node Q1 is at a low level, and the seventh transistor T7 is turned off. The high-level operating voltage provided through the second operating power supply terminal VGH is written to the second node Q2 through the fourth transistor T4, the voltage at the second node Q2 is at a high level, and both the third transistor T3 and the eighth transistor T8 are turned on. The low-level operating voltage provided through the first operating power supply terminal VGL is written to the first node Q1 through the third transistor T3, thereby maintaining the voltage of the first node Q1 at a low level. The low-level operating voltage provided through the first operating power supply terminal VGL is written to the first signal output terminal Gout1 through the eighth transistor T8, and the first signal output terminal Gout1 outputs a low-level voltage.

It should be noted that, in the waiting stage from the end of the reset stage of the shift register SR to the beginning of the next cycle, since the voltage at the pull-up node PU maintains the low-level state, the voltage at the driving signal output terminal Cout maintains the low-level state, and the voltage at the pull-down node PD maintains the high-level state, the operation process of the driving unit in the waiting stage is the same as that in the reset stage. That is, the first signal output terminal Gout1 of the driving unit continuously outputs the low-level voltage in the waiting stage.

In some embodiments, the driving unit further includes a second output circuit 4 (not shown in FIG. 5). As shown in FIG. 6, the second output circuit 4 is coupled to the pull-up node PU, the pull-down node PD, and a second signal output terminal Gout2, and is configured to output a voltage at the active level through the second signal output terminal Gout2 in the preset time period t0 under the control of the voltage of the pull-up node PU and the voltage of the pull-down node PD.

In the present disclosure, the second output circuit 4 can output a single pulse signal in the preset time period t0, so that the first gate line (the gate line G1 coupled to the control electrode of the switching transistor TFT in FIG. 1) in the pixel unit can be driven in the sensing stage. In this way, the driving unit according to the present disclosure can not only provide a driving signal for the sensing transistor in the pixel unit in the sensing stage, but also provide a driving signal for the switching transistor in the pixel unit at the same time, so that the number of gate driving circuits required in the display substrate can be effectively reduced, and the narrow bezel can be realized more advantageously.

In some embodiments, the second output circuit 4 is further coupled to the first control signal input terminal CLK1 (or, the first clock signal line), and the first operating power supply terminal VGL, and the second output circuit 4 is configured to: write the first clock signal provided through the first control signal input terminal CLK1 to the second signal output terminal Gout2 in the pre-charge stage and the output stage of the shift register SR under the control of the voltage of the pull-up node PU, the first clock signal being at the active level in the preset time period t0; and write the first operating voltage provided through the first operating power supply terminal VGL to the second signal output terminal Gout2 in the reset stage of the shift register SR under the control of the voltage of the pull-down node PD.

In some embodiments, the second output circuit 4 includes a ninth transistor T9 and a tenth transistor T10. A control electrode of the ninth transistor T9 is coupled to the pull-up node PU, a first electrode of the ninth transistor T9 is coupled to the first control signal input terminal CLK1, and a second electrode of the ninth transistor T9 is coupled to the second signal output terminal Gout2. A control electrode of the tenth transistor T10 is coupled to the pull-down node PD, a first electrode of the tenth transistor T10 is coupled to the second signal output terminal Gout2, and a second electrode of the tenth transistor T10 is coupled to the first operating power supply terminal VGL.

To facilitate understanding by those skilled in the art, the operation process of the second output circuit 4 will be described below.

In the pre-charge stage of the shift register SR, since the voltage at the pull-up node PU is at a high level and the voltage at the pull-down node PD is at a low level, the ninth transistor T9 is turned on and the tenth transistor T10 is turned off, and the first clock signal is written to the second signal output terminal Gout2 through the ninth transistor T9. Since the first clock signal is at a low level, the second signal output terminal Gout2 outputs a low-level voltage.

In the output stage of the shift register SR, since the voltage at the pull-up node PU is at a high level and the voltage at the pull-down node PD is at a low level, the ninth transistor T9 maintains an on state and the tenth transistor T10 maintains an off state, and the first clock signal is written to the second signal output terminal Gout2 through the ninth transistor T9. In the preset time period t0 of the output stage, since the first clock signal is at a high level, the second signal output terminal Gout2 outputs a high-level voltage.

Therefore, the second signal output terminal Gout2 of the driving unit according to the present disclosure can output a single pulse signal in the preset time period t0, so that the first gate line in the pixel unit can be driven in the sensing stage, and realization of narrow bezel is facilitated.

In the reset stage of the shift register SR, since the voltage at the pull-up node PU is at a low level and the voltage at the pull-down node PD is at a high level, the ninth transistor T9 is turned off and the tenth transistor T10 is turned on. The low-level operating voltage provided through the first operating power supply terminal VGL is written to the second signal output terminal Gout2 through the tenth transistor T10, and the second signal output terminal Gout2 outputs a low-level voltage.

In the embodiments of the present disclosure, each transistor in the driving unit may be an N-type transistor, or each transistor in the driving unit may be a P-type transistor. By adopting the same type of transistors in the driving unit, the transistors in the driving unit can be fabricated simultaneously through a same transistor fabrication process, and the production period can be effectively shortened.

Figure 9:
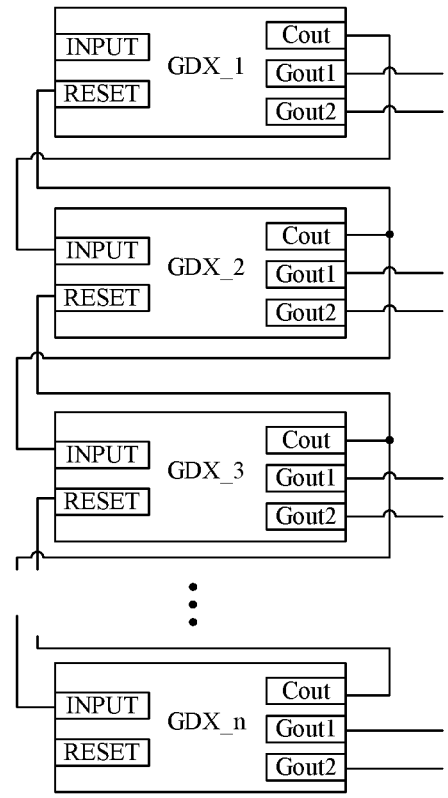
FIG. 9 is a schematic circuit diagram of a gate driving circuit according to an embodiment of the present disclosure.

According to another aspect of the present disclosure, there is provided a gate driving circuit. FIG. 9 is a schematic circuit diagram of a gate driving circuit according to an embodiment of the present disclosure. As shown in FIG. 9, the gate driving circuit includes several cascaded driving units GDX_1, GDX_2, . . . , GDX_n, and each of the driving units GDX_1, GDX_2, . . . , GDX_n may be the driving unit according to the above embodiments, and for the specific structure and operation of the driving unit, reference may be made to the description in the foregoing embodiments.

In the gate driving circuit, the driving signal output terminal Cout of the shift register SR of each of other driving units GDX_2, . . . , GDX_n except the first-stage driving unit GDX_1 is coupled to the reset signal input terminal RESET of the shift register SR of a previous-stage driving unit GDX_1, GDX_2, . . . , GDX_n−1. The driving signal output terminal Cout of the shift register SR of each of other driving units GDX_1, GDX_2, . . . , GDX_n−1 except a last-stage driving unit GDX_n is coupled to the pre-charge signal input terminal INPUT of the shift register SR of a next-stage driving unit GDX_2, . . . , GDX_n.

In this embodiment, the cascade connection of the driving units can be realized by using the driving signal output terminals Cout of the shift registers SR of the driving units GDX_1, GDX_2, . . . , GDX_n, and the driving of the first gate line G1 and the second gate line G2 in the pixel unit is realized by using the first signal output terminal Gout1 and the second signal output terminal Gout2 of each driving unit, respectively.

According to still another aspect of the present disclosure, a display substrate is provided. The display substrate includes a gate driving circuit, and the gate driving circuit may be the gate driving circuit according to the embodiments of the present disclosure. The display substrate according to the present disclosure is, for example, an OLED substrate.

Figure 10:
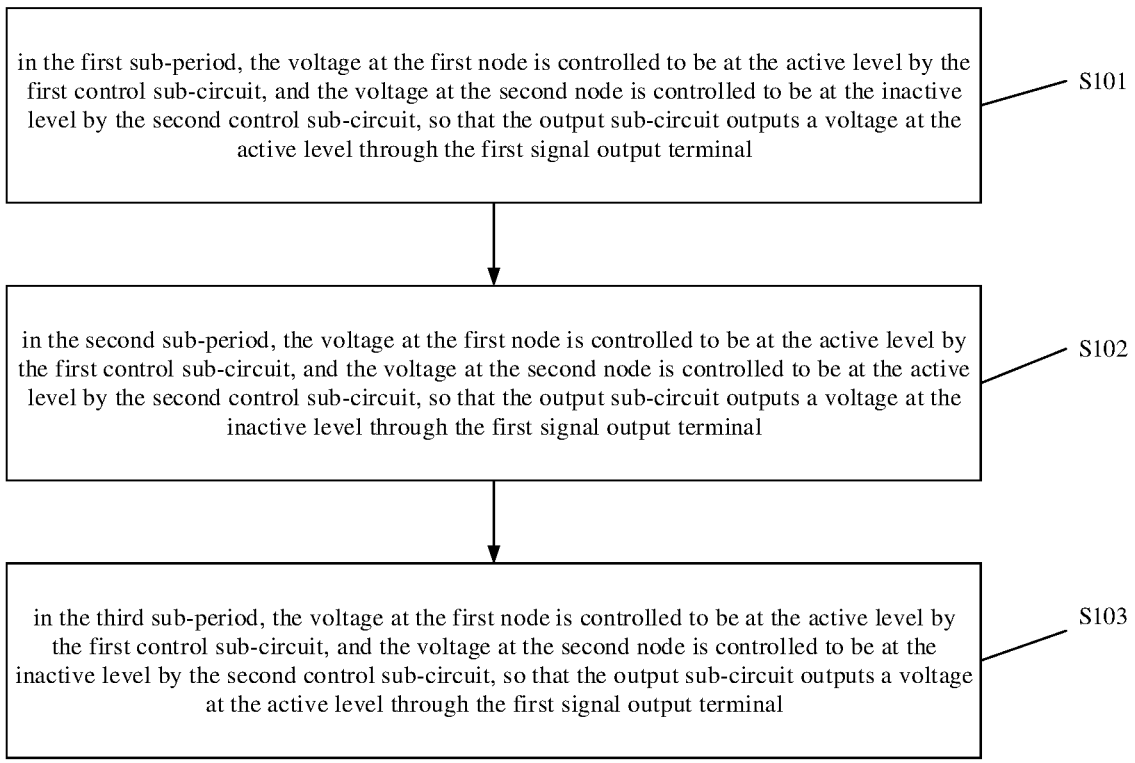
FIG. 10 is a flowchart of a driving method according to an embodiment of the present disclosure.

According to still another aspect of the present disclosure, a driving method is provided. FIG. 10 is a flowchart of a driving method for driving the driving unit described above according to an embodiment of the present disclosure. As shown in FIG. 10, the driving method may include the following steps S101 to S103.

In step S101, in the first sub-period, the voltage at the first node is controlled to be at an active level by the first control sub-circuit, and the voltage at the second node is controlled to be at an inactive level by the second control sub-circuit, so that the output sub-circuit outputs a voltage at the active level through the first signal output terminal.

In step S102, in the second sub-period, the voltage at the first node is controlled to be at the active level by the first control sub-circuit, and the voltage at the second node is controlled to be at the active level by the second control sub-circuit, so that the output sub-circuit outputs a voltage at the inactive level through the first signal output terminal.

In step S103, in the third sub-period, the voltage at the first node is controlled to be at the active level by the first control sub-circuit, and the voltage at the second node is controlled to be at the inactive level by the second control sub-circuit, so that the output sub-circuit outputs a voltage at the active level through the first signal output terminal.

For specific operations of steps S101 to S103, reference may be made to corresponding contents in the foregoing embodiments, and details thereof are not repeated here.

In some embodiments, in the preset time period, the voltage at the pull-up node is controlled to be at the active level by the pull-up circuit and the voltage at the pull-down node is controlled to be at the inactive level by the pull-down control circuit, and the voltage at the active level is output through the second signal output terminal of the second output circuit. The preset time period includes a first sub-period, a second sub-period, and a third sub-period that are successively arranged.

In some embodiments, the method further includes pre-charging the pull-up node by the pre-charge reset circuit before the first signal output terminal and the second signal output terminal respectively output voltages at the active level.

In some embodiments, the method further includes resetting the pre-charge reset circuit to disable the pull-up circuit and make the voltage at the pull-up node at the inactive level after the first signal output terminal and the second signal output terminal respectively output the voltages at the active level. At the same time, the voltage at the pull-down node is controlled by the pull-down control circuit to maintain at the active level, so that the driving signal output terminal outputs an inactive level signal, and the first signal output terminal and the second signal output terminal are respectively reset.

In some embodiments, the method further includes, after resetting the first signal output terminal and the second signal output terminal, controlling the voltage at the pull-up node to maintain at the inactive level by the pull-up circuit and controlling the voltage at the pull-down node to maintain at the active level by the pull-down circuit, so that the driving signal output terminal outputs an inactive level signal, and the first signal output terminal and the second signal output terminal respectively keep outputting reset levels.

In some embodiments, a duration of the preset time period is equal to a duration of the sensing stage, and the starting time and the ending time of the preset time period are aligned with the starting time and the ending time of the sensing stage, respectively.

In some embodiments, the duration of the preset time period is less than a duration of the stable display phase of the light emitting diode.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. A driving unit comprising: a shift register comprising a pull-up node, a pull-down node and a driving signal output terminal; and a first output circuit configured to output a double pulse signal in a preset time period under control of a voltage of the pull-up node, a voltage of the pull-down node and a voltage provided through the driving signal output terminal, wherein the first output circuit comprises: a first control sub-circuit, a second control sub-circuit and an output sub-circuit; the first control sub-circuit and the output sub-circuit are coupled at a first node, and the first control sub-circuit, the second control sub-circuit and the output sub-circuit are coupled at a second node;

the first control sub-circuit is coupled to the pull-up node and the pull-down node, and is configured to control a voltage at the first node to be at an active level in the preset time period under control of the voltage of the pull-up node, the voltage of the pull-down node, and a voltage at the second node, wherein the preset time period comprises: a first sub-period, a second sub-period and a third sub-period which are successively arranged;

the second control sub-circuit is coupled to the pull-down node and the driving signal output terminal, and is configured to control the voltage at the second node to be at an inactive level in the first sub-period and the third sub-period and to be at the active level in the second sub-period under control of the voltage of the pull-down node and the voltage provided through the driving signal output terminal; and the output sub-circuit is coupled to a first signal output terminal, and is configured to output a voltage at the active level through the first signal output terminal in response to the voltage at the first node being at the active level and the voltage at the second node being at the inactive level, and output a voltage at the inactive level through the first signal output terminal in response to the voltage at the second node being at the active level.

2. The driving unit of claim 1, wherein the first control sub-circuit comprises: a first transistor, a second transistor, and a third transistor;

a control electrode of the first transistor is coupled to the pull-up node, a first electrode of the first transistor is coupled to a first control signal input terminal, and a second electrode of the first transistor is coupled to the first node;

a control electrode of the second transistor is coupled to the pull-down node, a first electrode of the second transistor is coupled to the first node, and a second electrode of the second transistor is coupled to a first operating power supply terminal, wherein the first operating power supply terminal is configured to provide a first operating voltage at the inactive level; and a control electrode of the third transistor is coupled to the second node, a first electrode of the third transistor is coupled to the first node, and a second electrode of the third transistor is coupled to the first operating power supply terminal.

3. The driving unit of claim 2, wherein the second control sub-circuit comprises:
a fourth transistor and a fifth transistor;
a control electrode of the fourth transistor is coupled to the pull-down node, a first electrode of the fourth transistor is coupled to a second operating power supply terminal, and a second electrode of the fourth transistor is coupled to the second node, wherein the second operating power supply terminal is configured to provide a second operating voltage at the active level; and
a control electrode of the fifth transistor is coupled to the driving signal output terminal, a first electrode of the fifth transistor is coupled to the second node, and a second electrode of the fifth transistor is coupled to a second control signal input terminal.

4. The driving unit of claim 3, wherein the output sub-circuit comprises: a sixth transistor, a seventh transistor, an eighth transistor and a first capacitor,
a control electrode of the sixth transistor is coupled to the first control signal input terminal, a first electrode of the sixth transistor is coupled to the second operating power supply terminal, and a second electrode of the sixth transistor is coupled to the first node;
a control electrode of the seventh transistor is coupled to the first node, a first electrode of the seventh transistor is coupled to the second operating power supply terminal, and a second electrode of the seventh transistor is coupled to the first signal output terminal;
a control electrode of the eighth transistor is coupled to the second node, a first electrode of the eighth transistor is coupled to the first signal output terminal, and a second electrode of the eighth transistor is coupled to the first operating power supply terminal; and
a first terminal of the first capacitor is coupled to the first node, and a second terminal of the first capacitor is coupled to the first signal output terminal.

5. The driving unit of claim 4, further comprising: a second output circuit;
wherein the second output circuit is coupled to the pull-up node, the pull-down node, and the first signal output terminal, respectively, and is configured to output a voltage at the active level through a second signal output terminal in the preset time period under control of the voltage of the pull-up node and the voltage of the pull-down node.

6. The driving unit of claim 5, wherein the second output circuit comprises: a ninth transistor and a tenth transistor;
a control electrode of the ninth transistor is coupled to the pull-up node, a first electrode of the ninth transistor is coupled to the first control signal input terminal, and a second electrode of the ninth transistor is coupled to the second signal output terminal; and
a control electrode of the tenth transistor is coupled to the pull-down node, a first electrode of the tenth transistor is coupled to the second signal output terminal, and a second electrode of the tenth transistor is coupled to the first operating power supply terminal.

7. The driving unit of claim 4, wherein the shift register comprises a pre-charge reset circuit, a pull-up circuit, a pull-down circuit, and a pull-down control circuit; and
the pre-charge reset circuit is coupled to a pre-charge signal input terminal and a reset signal input terminal, respectively, and coupled to the pull-up circuit at the pull-up node, the pull-down circuit and the pull-down control circuit are coupled at the pull-down node, and the pull-up circuit and the pull-down circuit are coupled at the driving signal output terminal.

8. The driving unit of claim 7, wherein the pre-charge reset circuit comprises an eleventh transistor, a twelfth transistor, and a thirteenth transistor; the pull-down control circuit comprises a fourteenth transistor, a fifteenth transistor and a sixteenth transistor; the pull-up circuit comprises a seventeenth transistor and a second capacitor; the pull-down circuit comprises an eighteenth transistor;
a control electrode of the eleventh transistor is coupled to a fourth control signal input terminal, a first electrode of the eleventh transistor is coupled to the pre-charge signal input terminal, and a second electrode of the eleventh transistor is coupled to the pull-up node;
a control electrode of the twelfth transistor is coupled to the fourth control signal input terminal, a first electrode of the twelfth transistor is coupled to the pull-up node, and a second electrode of the twelfth transistor is coupled to a first electrode of the thirteenth transistor;
a control electrode of the thirteenth transistor is coupled to the reset signal input terminal, and a second electrode of the thirteenth transistor is coupled to the first operating power supply terminal;
a control electrode and a first electrode of the fourteenth transistor are respectively coupled to the second operating power supply terminal, and a second electrode of the fourteenth transistor is coupled to the pull-down node;
a control electrode of the fifteenth transistor is coupled to the pull-down node, a first electrode of the fifteenth transistor is coupled to the pull-up node, and a second electrode of the fifteenth transistor is coupled to the first operating power supply terminal;
a control electrode of the sixteenth transistor is coupled to the pull-up node, a first electrode of the sixteenth transistor is coupled to the pull-down node, and a second electrode of the sixteenth transistor is coupled to the first operating power supply terminal;
a control electrode of the seventeenth transistor is coupled to the pull-up node, a first electrode of the seventeenth transistor is coupled to a fifth control signal input terminal, and a second electrode of the seventeenth transistor is coupled to the driving signal output terminal;
a first terminal of the second capacitor is coupled to the pull-up node, and a second terminal of the second capacitor is coupled to the driving signal output terminal; and
a control electrode of the eighteenth transistor is coupled to the pull-down node, a first electrode of the eighteenth transistor is coupled to the driving signal output terminal, and a second electrode of the eighteenth transistor is coupled to the first operating power supply terminal.

9. The driving unit of claim 8, wherein all the transistors in the driving unit are transistors having a same conductivity type.

10. The driving unit of claim 7, wherein the pre-charge reset circuit comprises an eleventh transistor, a twelfth transistor, and a thirteenth transistor; the pull-down control circuit comprises a fourteenth transistor, a fifteenth transistor, a sixteenth transistor and a nineteenth transistor; the pull-up circuit comprises a seventeenth transistor and a second capacitor; the pull-down circuit comprises an eighteenth transistor;

a control electrode of the eleventh transistor is coupled to a fourth control signal input terminal, a first electrode of the eleventh transistor is coupled to the pre-charge signal input terminal, and a second electrode of the eleventh transistor is coupled to the pull-up node;

a control electrode of the twelfth transistor is coupled to the fourth control signal input terminal, a first electrode of the twelfth transistor is coupled to the pull-up node, and a second electrode of the twelfth transistor is coupled to a first electrode of the thirteenth transistor;

a control electrode of the thirteenth transistor is coupled to the reset signal input terminal, and a second electrode of the thirteenth transistor is coupled to the first operating power supply terminal;

a control electrode of the fourteenth transistor is coupled to the fourth control signal input terminal, a first electrode of the fourteenth transistor is coupled to the second operating power supply terminal, and a second electrode of the fourteenth transistor is coupled to the pull-down node;

a control electrode of the fifteenth transistor is coupled to the pull-down node, a first electrode of the fifteenth transistor is coupled to the pull-up node, and a second electrode of the fifteenth transistor is coupled to the first operating power supply terminal;

a control electrode of the sixteenth transistor is coupled to the pull-up node, a first electrode of the sixteenth transistor is coupled to the pull-down node, and a second electrode of the sixteenth transistor is coupled to the first operating power supply terminal;

a control electrode of the seventeenth transistor is coupled to the pull-up node, a first electrode of the seventeenth transistor is coupled to a fifth control signal input terminal, and a second electrode of the seventeenth transistor is coupled to the driving signal output terminal;

a first terminal of the second capacitor is coupled to the pull-up node, and a second terminal of the second capacitor is coupled to the driving signal output terminal;

a control electrode of the eighteenth transistor is coupled to the pull-down node, a first electrode of the eighteenth transistor is coupled to the driving signal output terminal, and a second electrode of the eighteenth transistor is coupled to the first operating power supply terminal; and a control electrode of the nineteenth transistor is coupled to the fifth control signal input terminal, a first electrode of the nineteenth transistor is coupled to the second operating power supply terminal, and a second electrode of the nineteenth transistor is coupled to the pull-down node.

11. The driving unit of claim 3, wherein the output sub-circuit comprises: a sixth transistor, a seventh transistor, an eighth transistor and a first capacitor;

a control electrode and a first electrode of the sixth transistor are respectively coupled to a third control signal input terminal, and a second electrode of the sixth transistor is coupled to the first node;

a control electrode of the seventh transistor is coupled to the first node, a first electrode of the seventh transistor is coupled to the third control signal input terminal, and a second electrode of the seventh transistor is coupled to the first signal output terminal;

a control electrode of the eighth transistor is coupled to the second node, a first electrode of the eighth transistor is coupled to the first signal output terminal, and a second electrode of the eighth transistor is coupled to the first operating power supply terminal; and a first terminal of the first capacitor is coupled to the first node, and a second terminal of the first capacitor is coupled to the first signal output terminal.

12. The driving unit of claim 11, further comprising a second output circuit;

wherein the second output circuit comprises: a ninth transistor and a tenth transistor;

a control electrode of the ninth transistor is coupled to the pull-up node, a first electrode of the ninth transistor is coupled to the first control signal input terminal, and a second electrode of the ninth transistor is coupled to a second signal output terminal; and a control electrode of the tenth transistor is coupled to the pull-down node, a first electrode of the tenth transistor is coupled to the second signal output terminal, and a second electrode of the tenth transistor is coupled to the first operating power supply terminal.

13. The driving unit of claim 3, wherein the first control signal input terminal is configured to provide a first clock signal, the second control signal input terminal is configured to provide a second clock signal, the first clock signal is at the active level in the preset time period, and the second clock signal is at the inactive level in the first sub-period and the third sub-period, and is at the active level in the second sub-period.

14. The driving unit of claim 1, wherein the pull-up node is configured to provide a voltage at the active level in the preset time period, the driving signal output terminal is configured to provide a voltage at the active level in the preset time period, and the pull-down node is configured to provide a voltage at the inactive level in the preset time period.

15. A gate driving circuit comprising: a plurality of cascaded driving units, wherein the driving unit is the driving unit of claim 1;

the driving signal output terminal of the shift register of each of other driving units except a first-stage driving unit is coupled to a reset signal input terminal of the shift register of a previous-stage driving unit; and the driving signal output terminal of the shift register of each of other driving units except a last-stage driving unit is coupled to a pre-charge signal input terminal of the shift register of a next-stage driving unit.

16. A display substrate comprising: the gate driving circuit of claim 15.

17. A driving method for driving a driving unit, the driving unit being the driving unit of claim 1, and the driving method comprising:

in the first sub-period, controlling, by the first control sub-circuit, the voltage at the first node to be at the active level, and controlling, by the second control sub-circuit, the voltage at the second node to be at the inactive level, so that the output sub-circuit outputs the voltage at the active level through the first signal output terminal;

in the second sub-period, controlling, by the first control sub-circuit, the voltage at the first node to be at the active level, and controlling, by the second control sub-circuit, the voltage at the second node to be at the active level, so that the output sub-circuit outputs the voltage at the inactive level through the first signal output terminal; and in the third sub-period, controlling, by the first control sub-circuit, the voltage at the first node to be at the active level, and controlling, by the second control sub-circuit, the voltage at the second node to be at the inactive level, so that the output sub-circuit outputs the voltage at the active level through the first signal output terminal.

18. The driving method of claim 17, wherein
in the preset time period, the voltage of the pull-up node is at the active level, the voltage of the pull-down node is at the inactive level, and the voltage provided through the driving signal output terminal is at the active level.

19. The driving method of claim 18, wherein
an operating cycle of the shift register comprises a pre-charge stage, an output stage and a reset stage,
in the pre-charge stage, the pull-up node is pre-charged;
in the output stage, a voltage at the active level is output through the driving signal output terminal under control of the voltage of the pull-up node;
in the reset stage, the pull-up node is reset, the voltage of the pull-down node is controlled to be at the active level, and a voltage at the inactive level is output through the driving signal output terminal,
wherein the preset time period is within the output stage.

* * * * *